(12) United States Patent
Wang et al.

(10) Patent No.: US 7,818,643 B2
(45) Date of Patent: Oct. 19, 2010

(54) METHOD FOR BLOCKING UNKNOWN VALUES IN OUTPUT RESPONSE OF SCAN TEST PATTERNS FOR TESTING CIRCUITS

(75) Inventors: Seongmoon Wang, Princeton Junction, NJ (US); Srimat T Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 137 days.

(21) Appl. No.: 12/034,088

(22) Filed: Feb. 20, 2008

(65) Prior Publication Data

US 2009/0210762 A1  Aug. 20, 2009

(51) Int. Cl.
*G01R 31/28* (2006.01)

(52) U.S. Cl. ...................... 714/729; 714/727

(58) Field of Classification Search ............ 716/1; 714/726, 724, 733, 738, 729, 727
See application file for complete search history.

(56) References Cited

U.S. PATENT DOCUMENTS

| | | | | |
|---|---|---|---|---|
| 6,557,129 | B1 * | 4/2003 | Rajski et al. | 714/729 |
| 6,789,221 | B2 * | 9/2004 | Hapke | 714/733 |
| 7,197,721 | B2 * | 3/2007 | Patil et al. | 716/1 |
| 7,237,162 | B1 * | 6/2007 | Wohl et al. | 714/726 |
| 7,376,873 | B2 * | 5/2008 | Vranken et al. | 714/724 |
| 2006/0236186 | A1 * | 10/2006 | Wang et al. | 714/738 |

* cited by examiner

*Primary Examiner*—David Ton
(74) *Attorney, Agent, or Firm*—Joseph J. Kolodka

(57) ABSTRACT

A method includes compressing control patterns describing values required at the control signals of blocking logic gates, by linear feedback shift register LFSR reseeding; bypassing blocking logic gates for some groups of scan chains that do not capture unknown values in output response of scan test patterns for testing circuits; and reducing numbers of specified bits in densely specified ones of the control patterns for further reducing the size of a seed of the LFSR.

12 Claims, 2 Drawing Sheets

(a)      (b)      (c)

METHOD FOR BLOCKING UNKNOWN VALUES IN OUTPUT RESPONSE OF SCAN TEST PATTERNS FOR TESTING CIRCUITS

BACKGROUND OF THE INVENTION

The present invention relates generally to testing compression techniques as applied to semiconductor logic circuitry, and, more particularly, to a method for blocking unknown values in output response of scan test patterns for testing circuits.

Continuous scaling of semiconductor technology has increased IC chip complexity. As the design complexity increases, test data volume also increases rapidly. Since test data volume is a major factor that determines test cost, several test compression techniques including commercial tools to reduce both volume of input test patterns and output responses have been developed. Spatial compaction reduces response data volume by reducing the number of outputs (typically outputs of scan chains) that are observed by the automatic test equipment (ATE). Another approach, temporal compaction, reduces response data volume by compressing a long sequence of responses into a single signature, which is smaller than the size of even a single output response. Hence using a temporal compactor such as multiple input signature register (MISR) can drastically reduce response data volume.

The presence of unknown values (unknowns for short) in output responses of scan test patterns creates a lot of complications for test data compression. Especially, entrance of any unknown into a temporal compactor can be catastrophic since it corrupts the signature of output responses over the entire period of testing time. Unknowns can occur due to the presence of non-scan flip-flops, embedded memories, or tristate buffers. Limitation in accuracy of simulation can also produce unknowns. To prevent corrupting the signature, every unknown that appears at outputs must be blocked before it enters the temporal compactor. Techniques to block unknowns for temporal compaction have been proposed. Since blocking unknowns for temporal compaction requires control data that also contribute to overall test data volume, it is important to reduce control data volume.

A selective compactor scheme where only one scan chain output is observed (not blocked) at any scan shift cycle has been proposed. The selective enhanced selective compactor proposed can observe multiple scan chains at a scan shift cycle at the expense of higher area overhead and larger control data volume. The simple channel masking technique is commonly used in Logic Built-in Self-Test (LBIST). In this scheme, fault effects that are scanned out at scan shift cycles when all scan chains are blocked cannot be observed. An enhanced channel masking scheme presented improves observability of the simple channel masking scheme.

One unknown blocking scheme is based on LFSR reseeding for LBIST. In order to reduce the number of seeds that are stored in an on-chip memory, a best feedback polynomial of LFSR is searched from a set of different degrees of polynomials. The critical drawback of this method is its prohibitive run time. It has been shown that run time for computing control data and control data sizes can be significantly reduced by using an efficient process. Another unknown masking technique proposed uses a combinational logic called XML to generate blocking control signals. Since the process used to minimize hardware overhead for the XML is based on traversing the large fault isolation table, the main drawback of this method is its huge memory space requirement. Since the hardware (XML) for this method is customized for a specific set of test responses, the whole XML should be redesigned for any design change.

All unknown blocking schemes introduced above block not only unknowns but also errors (fault effects) for modeled and unmodeled faults. With one unknown blocking scheme based on LFSR reseeding, the signal probability of every output of an LFSR is 0.5. In other words, if a long sequence of control patterns is generated, the output of every LFSR stage will be set to 1 (0) in 50% of clock cycles. Hence, 50% response data that are scanned out of outputs of scan chains will be blocked, i.e., not be observed. Not observing some scan cells can result in decrease in modeled and/or unmodeled fault coverage.

A large IC chip is comprised of several sub-blocks. Sources of unknowns are typically located in only a few sub-blocks. For example, if a sub-block requires very tight timing, some flip-flops in the sub-block are not scanned so that they function as unknown sources during scan based testing. Each scan chain is usually routed with flip-flops in the same sub-block since mixing flip-flops in different sub-blocks together into one scan chain makes diagnosis difficult. Hence typically most unknowns are captured in scan chains for a few sub-blocks.

Accordingly, there is a need for a new unknown blocking scheme based on LFSR reseeding that can minimize control data volume and maximize the number of scan cells that are observed, especially for designs where unknowns concentrate in a part of the design.

SUMMARY OF THE INVENTION

In accordance with the invention, a method includes compressing control patterns describing values required at the control signals of blocking logic gates, by linear feedback shift register LFSR reseeding; bypassing blocking logic gates for some groups of scan chains that do not capture unknown values in output response of scan test patterns for testing circuits; and reducing numbers of specified bits in densely specified ones of the control patterns for further reducing the size of a seed of the LFSR.

In another aspect of the invention, a method for blocking unknown values in output response of scan test patterns for testing circuits includes compressing control patterns describing values required at control signals of blocking logic gates by linear feedback shift register LFSR reseeding, clustering scan chains into a number of groups; connecting outputs of the scan chains in each group to bypassing gates that are controlled by the same control signal before blocking logic gates; connecting outputs of blocking logic gates in each group to a separate MISR; and bypassing, with the bypassing gates, blocking logic gates corresponding to scan chains in the group that do not capture unknown values in the outputs.

BRIEF DESCRIPTION OF DRAWINGS

These and other advantages of the invention will be apparent to those of ordinary skill in the art by reference to the following detailed description and the accompanying drawings.

DETAILED DESCRIPTION

The invention presents a new blocking logic to block unknowns for temporal compactors. The proposed blocking logic can reduce data volume required to control the blocking logic and also improve the number of scan cells that are observed by temporal compactors. Control patterns, which describe values required at the control signals of the blocking logic, are compressed by LFSR reseeding. In the inventive method, scan chains are clustered into several groups and the outputs of the scan chains in each group are connected to 2-input AND gates that are controlled by the same control signal before the blocking logic gates. If no scan chains in a group capture unknowns, then the corresponding blocking logic gates are bypassed by the 2-input AND gates. Hence no bits need to be specified in the control pattern for that group. This can significantly reduce the number of 0's that should be specified to propagate errors for observation. Since all the scan cells in the group are observed, bypassing can improve observability. Numbers of specified bits in highly specified test patterns are reduced by not observing one or more scan chain groups. The scan chains groups that are not observed are selected such that no decrease in fault coverage results.

Figure 1:
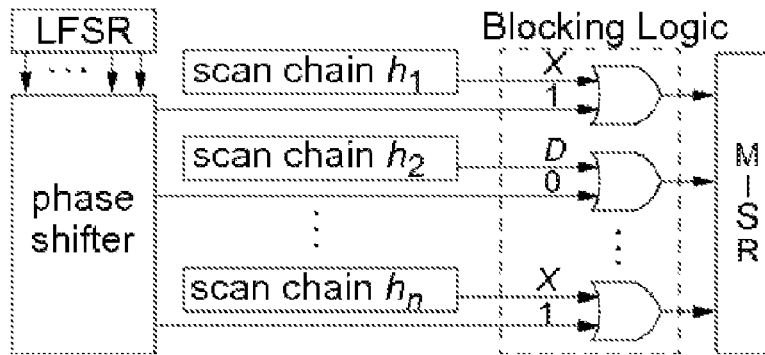
FIG. 1 is a block diagram illustrating a linear feedback shift register based blocking scheme used in the prior art.

FIG. 1 describes the LFSR reseeding based unknown blocking scheme used in prior work. Every unknown value that is scanned out of the output of a scan chain (see X's on the outputs of scan chains $h_1$ and $h_n$) in a shift cycle must be blocked to prevent it from corrupting the signature by setting the control input of the corresponding blocking logic gate to a 1. On the other hand, errors that need to be observed should propagate to the MISR through the blocking logic gate. For example, in FIG. 1, since an error (denoted by D) that needs to be observed is scanned out of the output of $h_2$ in the current cycle, the control input of the blocking logic gate for $h_2$ is set to a 0. The LFSR should be loaded with appropriate seeds to block all unknowns and propagate the errors that need to be observed to the MISR. These seeds should be stored in the ATE memory prior to test application along with test data. Hence, if the size of seeds is large, it will increase overall data volume to be stored in the ATE memory. (In this paper, we use a scheme that loads a new seed into the control LFSR for each test pattern.) When test patterns are compressed by LFSR reseeding, normally the size of seeds, i.e., the number of stages of LFSR, is determined by the number of specified bits in the most specified test pattern among all test patterns. If the number of specified bits in the most specified test pattern is $S_{max}$, the number of stages of LFSR required is given by $S_{max}+M$, where M is a margin to ensure that the equations are solvable. Hence, it is important to minimize the number of specified bits in the most specified pattern.

To minimize volume of control data, control pattern $c_i$ that has minimal number of care bits is computed for every test pattern $p_i$. Every scan cell that captures an unknown should be assigned 1's in $c_i$ (assume that the blocking logic is comprised of only OR gates). The number of specified bits in each control pattern is minimized by minimizing the number of bits that are specified to 0's to observe errors. To reduce the number of care bits in $c_i$, we reduce the number of faults that are targeted by test pattern $p_i$. Note that if a fault f is detected not only by $p_i$ but also by many other test patterns, then even if f is not observed when $p_i$ is applied, there is a high chance that fault f will be detected by other test patterns. Once a set of faults $F_i$ that should be detected by test pattern $p_i$ is determined, then the minimum number of scan cells required to observe all faults in $F_i$ are selected. Fault set $F_i$ is called the target fault list of $p_i$. Typically, a fault is captured into multiple scan cells and some scan cells capture fault effects for multiple faults. Since observing only one fault effect is enough to detect the fault, only one fault effect is selected for observation for every fault in $F_i$.

Figure 2:
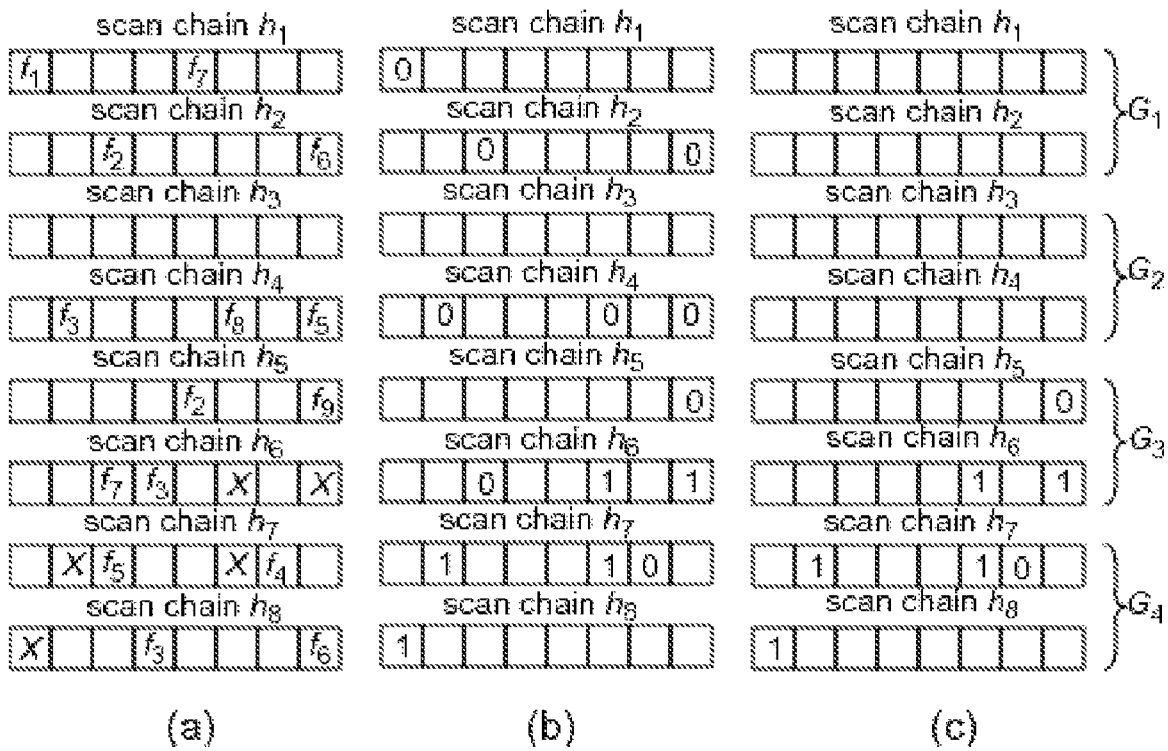
FIG. 2(a) is a diagram showing a response loaded into scan cells.
FIG. 2(b) is a diagram of the control pattern obtained using the procedure with the scheme shown in FIG. 1 for the test response of FIG. 2(a).
FIG. 2(c) shows a corresponding control pattern for the blocking logic in accordance with the invention.

FIG. 2(b) gives control pattern $c_i$ obtained by using the procedure described above for the test response shown in FIG. 2(a). The scan cells that capture unknown values are assigned 1's in $c_i$. Assume that the target fault list of $p_i$ contains faults $f_1, f_2, \ldots, f_7$. Hence $c_i$ is specified to observe fault effects for these 7 faults. Only one fault effect is selected for each fault for observation. For example, although fault effects of $f_2$ are captured into the third scan cell of scan chain $h_2$ and fifth scan cell of scan chain $h_5$, only the third scan cell of scan chain $h_2$ is selected for observation and assigned a 0 in $c_i$. $c_i$ requires 14 specified bits.

After a control pattern $c_i$ that has minimal number of specified bits is computed for test pattern $p_i$, a seed is computed for $c_i$ by using a linear solver. Then the LFSR pattern $cr_i$ that will be generated by the LFSR/phase shifter from the seed for $c_i$ is computed by simulating the LFSR/phase shifter. During the simulation, the LFSR is loaded with the seed for $c_i$ and clocked for l cycles, where l is the number of scan cells in the longest scan chain.

Figure 3:
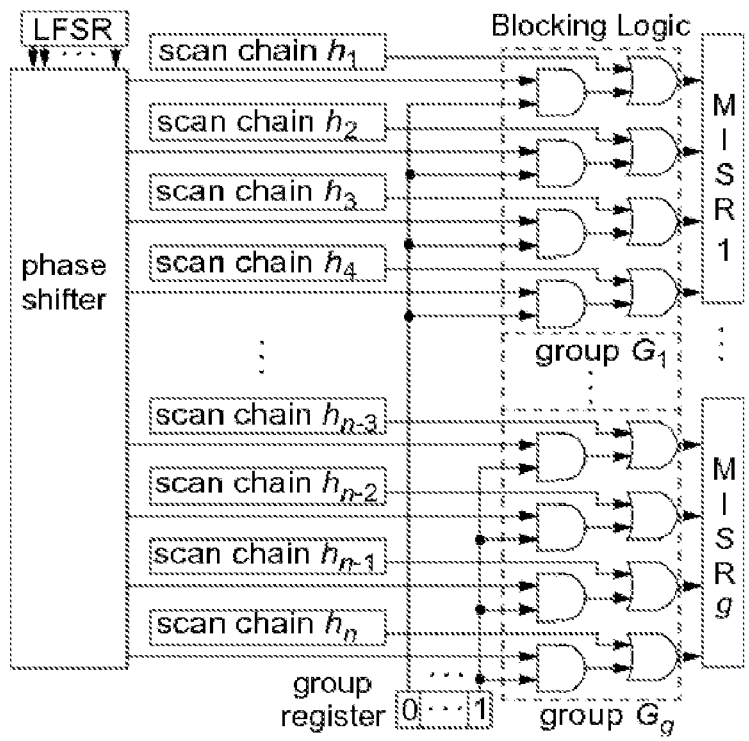
FIG. 3 is a diagram of an exemplary architecture employing an unknown blocking technique in accordance with the invention.

FIG. 3 depicts a scan design that employs the inventive unknown blocking technique. There are a few differences between the blocking logic of the proposed technique and that of prior work, which is shown in FIG. 1. Note that the blocking logic of the proposed method has an extra 2-input AND gate before each OR gate of the blocking logic. One input of each 2-input AND gate is driven by an output of the phase shifter and the other input is driven by an output of the group register. The n scan chains are divided into g groups and all the 2-input AND gates that are connected to the outputs of scan chains that belong to the same group are driven by a common output of the group register. Hence if i-th bit of the group register is assigned 0, then the values captured in all scan cells in i-th group enter the corresponding MISR, independent of the output states of the phase shifter. The outputs of scan chains in each group are connected to a separate MISR. Each group may contain a different number of scan chains although in the example shown in FIG. 3, every group consists of 4 scan chains. In this paper, all scan chains that can capture unknowns are placed into a few scan chain groups. These scan chain groups, which are assigned 1's in the group register such as $G_g$ of FIG. 3, are called unknown capturing scan chain groups or UCGs. On the other hand, scan chain groups that capture no unknowns are called unknown free scan chain groups or UFGs and assigned 0's in the group register such as $G_1$.

Control Patterns for the Proposed Method

The proposed blocking logic can significantly reduce data volume for control patterns and improve observability over the prior art.

1. Reducing 0's in Control Patterns

The control pattern for prior work shown in FIG. 2(b) requires 14 specified bits. In the following, we show that the number of 0's in the control pattern for the same test response can be significantly reduced by using the proposed blocking logic. Consider computing a control pattern $c_i$ for the proposed blocking logic (see FIG. 2(c)) for the test response shown in FIG. 2(a). Assume that scan chains are clustered into 4 groups, $G_1, \ldots, G_4$. Only the scan cells in groups $G_3$ and $G_4$ capture unknowns and no other scan cells capture unknowns. Hence $G_1$ and $G_2$ are assigned 0's in the group register and all scan cells in these scan chain groups can be observed without specifying any bit of $c_i$ to 0 for them. All the 7 faults except 2 faults $f_4$ and $f_9$ in the target fault list of $p_i$ can be detected by observing $G_1$ and $G_2$. Although the proposed scheme can reduce the number of 1's too (see the next section), assume that all scan cells that capture unknowns are assigned 1's in the control pattern for now. Hence, 5 bits are assigned 1's to block the unknowns in the control pattern. Only two additional bits need to be specified to 0's to observe fault effects for $f_4$ and $f_9$. In consequence, total only 7 bits (5 1's and 2 0's) need to be specified in the control pattern for the proposed blocking logic.

As described above, data for the group register are determined according to scan chains that capture unknowns. A simple method to identify scan cells that can capture unknowns is to simulate the design with a set of random patterns. During the simulation, all scan chains that contain scan cells that capture unknown(s) in the response to any random pattern are identified. These scan chains are grouped together into 2-3 UCGs (UCGs are assigned 1's in the group register). Since the number of groups, i.e., the number of stages of the group register, is small and the group register need not be updated often with different data (in most cases, the group register needs to be loaded only once during the entire test session), data volume for the group register is negligible.

2. Reducing Specified Bits in Densely Specified Control Patterns

In LFSR reseeding, the size of seeds (or the number of stages of the LFSR) is normally determined by the number of specified bits in the most specified pattern among all patterns. Hence even if there is only one control pattern that has large number of specified bits and all the other responses have very few specified bits, the blocking logic will require large seed size, which in turn results in large control data volume.

The numbers of specified bits in densely specified control patterns are reduced as follows. Initially, a control pattern that requires minimum number of specified bits is computed for every test pattern. Assume that an LFSR with $S_{max}+M$ stages is used to generate control sequences for the blocking logic. First, we select a set of control patterns that have more than $S_{max}$ specified bits. Let this set be $C_d$ and the set that includes all the other control patterns be $C_s$. Next, we compute a seed for every control pattern $c_i$ in $C_s$ and calculate the LFSR pattern $cr_i$ from the computed seed by simulating the LFSR operation as described in Section 2. We apply $cr_i$ to the blocking logic and drop all faults that are observed not only from the target fault list of $p_i$ but also from target fault lists of all the other test patterns. The signatures of all MISRs are updated. Hence, many faults will be dropped from target fault lists of test patterns for which control patterns are in $C_d$ when processing all control patterns in $C_s$ is complete. Then the signatures of all MISRs are reset.

Now we start processing control patterns in $C_d$. Numbers of specified bits of these control patterns are reduced by unspecifying the bits that are specified for scan cells in one or more UCGs, i.e., by not observing scan cells in one or more UCGs. The UCG(s) for which bits are unspecified in $c_i$ are called the unobserved UCGs of $c_i$. For every control pattern $c_i$ in $C_d$, we first drop the faults that are captured in scan cells in UFGs, i.e., unknown free scan chain groups (these faults are always observed independent of control sequences generated by the LFSR). The unobserved UCGs are selected to avoid decrease in fault coverage. We first unspecify the specified bits for all the UCGs from $c_i$. The number of remaining target faults of $p_i$ that are captured in each UCG is counted. Then we select a UCG $G_m$ that captures the largest number of target faults of $p_i$, mark the UCG, and specify $c_i$ to block all unknowns and observe all target faults of $p_i$ that are captured in $G_m$. If the number of specified bits of $c_i$ is small enough for the linear solver to find a seed for $c_i$, then we drop the faults from the target fault list of $p_i$ whose fault effects are captured in the scan cells that are assigned 0's in $c_i$. Otherwise we unspecify back the bits that are specified for $G_m$ from $c_i$. Then we select another UCG among the unmarked UCGs that captures the largest number of target faults of $p_i$. We repeat the procedure described above in this paragraph until all UCGs are marked. When all UCGs are marked, we select the next control pattern and determine the unobserved UCGs for it. This is repeated until a set of unobserved UCGs is determined for every control pattern in $C_d$.

If in the response to test pattern $p_i$, an unobserved UCG captures at least one target fault that is captured only in that UCG (the fault is captured in no other scan chain group), then not observing the UCG will make some faults undetected. If this is the case for a control pattern $c_i$ (it does not occur often since many faults in the target faults of $p_i$ have already been dropped and very few faults remain), then $c_i$ is applied twice during test application. In each of the two applications, a different UCG is selected as the unobserved UCG. This guarantees detection of all target faults of $p_i$.

After unobserved UCGs are determined for every control pattern in $C_d$, the control patterns in $C_d$ are sorted by their unobserved UCGs such that test patterns for which control patterns have the same unobserved UCGs are consecutively applied during test application. After all test patterns for which control patterns have the same unobserved UCGs are applied, the signatures in all MISRs are scanned out and the MISRs are reset before the next group of test patterns are applied.

Figure 4:
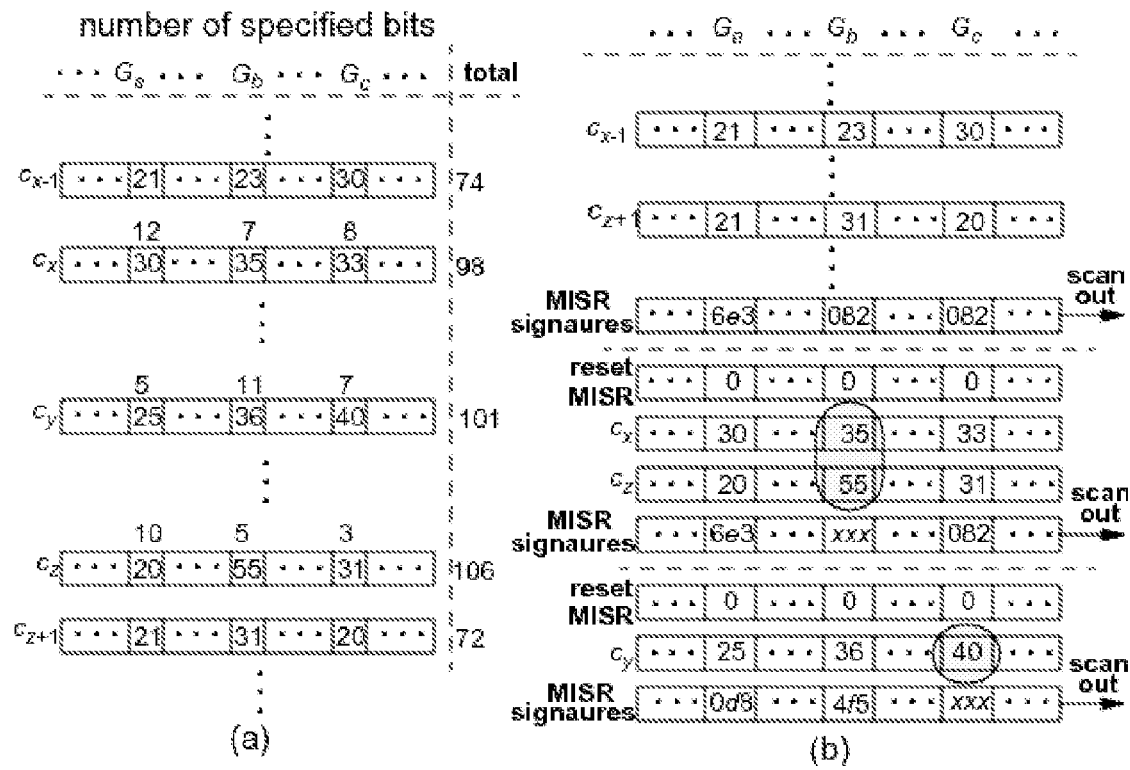
FIG. 4(a) shows numbers of specified bits in each control pattern required for unknown capturing scan chain groups UCGs, in accordance with the invention.
FIG. 4(b) shows sorted control patterns and signatures under the unknown blocking technique in accordance with the invention.

FIG. 4(a) shows numbers of specified bits in each control pattern required for the UCGs $G_a$, $G_b$, and $G_c$ and the total number of specified bits (the column "total"). For example, control pattern $c_{x-1}$ requires respectively 21, 23 and 30 specified bits for $G_a$, $G_b$ and $G_c$ and total 74 specified bits. Assume that $S_{max}=75$ is given for the control LFSR. All control patterns other than $c_x, c_y$, and $c_z$ require fewer than 75 specified bits. Hence $C_d=\{c_x,c_y,c_z\}$ and $C_s=\{$all control patterns except $c_x, c_y$ and $c_z\}$. An LFSR seed is computed for every control pattern in $C_s$ and the faults that are observed are dropped from target fault lists of all test patterns including test patterns for which control patterns are in $C_d$. As more faults are dropped, fewer specified bits are required in each control pattern. After all test patterns except $p_x, p_y$, and $p_z$ for which control patterns are in $C_d$ are applied to the scan chains, the signatures in the MISRs are scanned out for comparisons with good signatures. Then all MISRs are reset.

Now control patterns in $C_d$ are processed to compute seeds for them. Control pattern $c_x$ is taken first from $C_d$ and all specified bits of $c_x$ that were specified for the three UCGs are unspecified. The faults that are captured in UFGs are dropped from the target fault list of $p_x$. Since $G_a$ captures the largest number of faults, 12 (in FIG. 4(a), the number over the number of specified bits required for each UCG represents the number of target faults captured in the UCG), the bits for $G_a$ are specified to block unknowns and to observe the 12 faults. $G_a$ is marked. Since the number of specified bits of $c_x$ is only 30 (smaller than $S_{max}=75$), the linear solver finds a seed for $c_x$. The faults whose fault effects are captured in the scan cells that are assigned 0's in $c_x$ are dropped from the target fault list of $p_x$. Since $G_c$ captures more faults than $G_b$, $G_c$ is marked next and the bits for $G_c$ are additionally specified in $c_x$. Since the number of specified bits of $c_x$ is only 63 (the sum of bits that are specified for $G_a$ and $G_c$), the linear solver still finds a seed for $c_x$. The faults whose fault effects are captured in the scan cells that are assigned 0's in $c_x$ are dropped from the target fault list of $p_x$. Since the only unmarked UCG is $G_b$, $G_b$ is marked next and the bits for $G_b$ are specified in $c_i$. Since the number of specified bits of $c_x$ now becomes 98, which is far greater than $S_{max}$, the linear solver does not find a seed for $c_x$. The bits that are specified for $G_b$ are unspecified back and $G_b$ is determined as the unobserved UCG of $c_x$. If there are faults in the target fault list of $p_x$ that can be detected only by observing $G_b$, then $p_x$ will be applied one more time. In the control pattern for the second application of $p_x$, a UCG other than $G_b$ is selected as the unobserved UCG. A seed is computed for $c_x$ and observed faults are dropped from all target fault lists.

Since there are no further unmarked UCGs, we take the next control pattern $c_y$ from $C_d$ and process the UCGs in the order of $G_b$, $G_c$, and $G_a$ (according to the number of faults captured in each UCG) to determine the unobserved UCGs. Since specifying $c_y$ for $G_c$ after $G_b$ makes the number of specified bits of $c_y$ 76, which is greater than $S_{max}$, the bits of $c_y$ that are specified for $G_c$ are unspecified back. Specifying bits for the remaining unmarked UCG, $G_a$, makes the number of specified bits of $c_y$ only 61. Hence $G_c$ is determined to be the unobserved UCG of $c_y$. Using the same procedure that were used for $c_x$ and $c_y$, $G_b$ is determined to be the unobserved UCG of $c_z$.

Control patterns in $C_d$ are now sorted into two different groups. For the first group, which includes $c_x$ and $c_z$, $G_b$ is not observed and for the second group, which includes only $c_y$, $G_c$ is not observed. Since they are not observed (compared with good signatures), the signatures for unobserved UCGs are denoted by xxx in FIG. 4(b).

3. Improving Observability

Another advantage of the proposed scheme over prior work is better observability. If an LFSR is used to generate control signals for the blocking logic, then on an average only 50% of scan cells are observed. In contrast, in the proposed scheme, all scan cells in the groups that are assigned 0's in the group register are observed. For example, in FIG. 2(c), since all scan cells in UFGs, $G_1$ and $G_2$, are observed, 75% scan cells can be observed (assume that approximately 50% scan cells of $G_3$ and $G_4$ are observed).

The invention presents a new blocking logic to block unknowns for temporal compactors. The proposed blocking logic can reduce data volume required to control the blocking logic and also improve the number of scan cells that are observed by temporal compactors. Control patterns, which describe values required at the control signals of the blocking logic, are compressed by LFSR reseeding. In the inventive method, scan chains are clustered into several groups and the outputs of the scan chains in each group are connected to 2-input AND gates that are controlled by the same control signal before the blocking logic gates. If no scan chains in a group capture unknowns, then the corresponding blocking logic gates are bypassed by the 2-input AND gates. Hence no bits need to be specified in the control pattern for that group. This can significantly reduce the number of 0's that should be specified to propagate errors for observation. Since all the scan cells in the group are observed, bypassing can improve observability. Numbers of specified bits in highly specified test patterns are reduced by not observing one or more scan chain groups. The scan chains groups that are not observed are selected such that no decrease in fault coverage results. Experimental results show that control patterns for the proposed blocking logic require very small number of specified bits. The number of scan cells that are observed by the proposed blocking logic is close to that of scan cells that can be achieved by direct observation even under existence of many unknowns in responses. Run time of the proposed method is several orders of magnitude shorter than that of prior work. Experiments with large industrial designs clearly demonstrate scalability of the proposed method. Since only n 2-input AND gates, where n is the number of scan chains in the design, and a small group register are only additional hardware to the blocking logic of prior work, hardware overhead for the proposed blocking logic is very low.

The present invention has been shown and described in what are considered to be the most practical and preferred embodiments. It is anticipated, however, that departures may be made therefrom and that obvious modifications will be implemented by those skilled in the art. It will be appreciated that those skilled in the art will be able to devise numerous arrangements and variations, although not explicitly shown nor described herein, embody the principles of the invention and are within their spirit and scope.

What is claimed is:

1. A method comprising the steps of:
   compressing control patterns describing values required at the control signals of blocking logic gates, by linear feedback shift register LFSR reseeding;
   bypassing blocking logic gates for some groups of scan chains that do not capture unknown values in output response of scan test patterns for testing circuits; and
   reducing numbers of specified bits in densely specified ones of the control patterns for further reducing the size of a seed of the LFSR.

2. The method of claim 1, further comprising the step of connecting inputs of bypassing gates to outputs of the scan chains belonging to the same group.

3. The method of claim 1, further comprising the step of driving all bypassing gates connected to the outputs of the scan chains belonging to the same group by a common output of a group register.

4. The method of claim 1, wherein if a certain bit of a group register is assigned the bypassing value then values captured in all scan cells in a certain group enter a corresponding multiple signature input register MISR.

5. The method of claim 4, wherein values captured in all scan cells in the certain group enter a corresponding MISR independent of output states of a phase shifter.

6. The method of claim 1, further comprising the step of connecting outputs of scan chains in each group to a separate multiple input signature register MISR.

7. The method of claim 6, wherein each group may contain a different number of scan chains.

8. The method of claim 1, wherein the step of reducing numbers of specified bits comprises unspecifying bits that are specified for scan cells in one or more unknown capturing scan chain groups UCGs, wherein scan chains that capture unknowns are placed into a few scan chains and UCGs are those scan chain groups assigned a nonbypassing value in a group register.

9. The method of claim 1, wherein the step of reducing numbers of specified bits comprises after all test patterns for which control patterns have same unobserved unknown capturing scan chain groups UCGs are applied, signatures in all multiple input signature registers MISRs are scanned out and the MISRs are reset before the next group of test patterns are applied.

10. A method for blocking unknown values in output response of scan test patterns for testing circuits, comprising the steps of:
    compressing control patterns describing values required at control signals of blocking logic gates by linear feedback shift register LFSR reseeding, clustering scan chains into a number of groups;
connecting outputs of the scan chains in each group to bypassing gates that are controlled by the same control signal before blocking logic gates;
connecting outputs of blocking logic gates in each group to a separate MISR; and
bypassing, with the bypassing gates, blocking logic gates corresponding to scan chains in the group that do not capture unknown values in the outputs.

11. The method of claim 10, further comprising the step of reducing numbers of specified bits in highly specified test patterns by not observing at least one scan chain group.

12. The method of claim 10, further comprising the step of selecting scan chain groups that are not observed such that no decrease in fault coverage results.

* * * * *